United States Patent [19]

Brillouet et al.

[11] Patent Number: 4,766,472

[45] Date of Patent: Aug. 23, 1988

[54] MONOLITHIC SEMICONDUCTOR STRUCTURE OF A LASER AND A FIELD EFFECT TRANSISTOR

[76] Inventors: François Brillouet, 34Bis rue des Fontaines, 92310 Sevres; Krishna Rao, 1 rue du Moulin de Pierre, 92310 Issy les Moulineaux; Francois Alexandre, 11 rue des Recollets, 75010 Paris, all of France

[21] Appl. No.: 2,407

[22] Filed: Jan. 5, 1987

[30] Foreign Application Priority Data

Jan. 6, 1986 [FR] France ................................ 86 00089

[51] Int. Cl.$^4$ ................... H01L 31/12; H01L 29/761; H01L 33/00; H01S 3/19
[52] U.S. Cl. ........................................ 357/19; 357/16; 357/17; 357/4; 357/23.2; 357/41; 372/50; 372/46; 372/47
[58] Field of Search .................. 357/16, 17, 41, 4, 19, 357/23.2, 30 B, 30 E, 30 G, 30 I, 55, 58; 372/50, 46, 47

[56] References Cited

U.S. PATENT DOCUMENTS

| | | | |
|---|---|---|---|
| 4,352,116 | 9/1982 | Yariv et al. | 357/17 |
| 4,361,887 | 11/1982 | Nakamura et al. | 357/17 |
| 4,366,567 | 12/1982 | Fukuzawa et al. | 357/17 |
| 4,438,446 | 3/1984 | Tsang | 357/17 |
| 4,438,447 | 3/1984 | Copeland, III et al. | 357/16 |
| 4,503,600 | 3/1985 | Nii et al. | 357/22 A |
| 4,607,368 | 8/1986 | Hori | 357/17 |
| 4,608,646 | 8/1986 | Law et al. | 357/17 |
| 4,630,083 | 12/1986 | Yamakoshi | 357/17 |
| 4,641,161 | 2/1987 | Kim et al. | 357/22 A |
| 4,673,959 | 6/1987 | Shiraki et al. | 357/16 |

FOREIGN PATENT DOCUMENTS

| | | | |
|---|---|---|---|
| 0080714 | 9/1985 | European Pat. Off. | 357/16 |
| 0166593 | 1/1986 | European Pat. Off. | 357/17 |
| 0085093 | 6/1980 | Japan | 372/47 |
| 0021887 | 2/1983 | Japan | 372/50 |

OTHER PUBLICATIONS

Japanese Journal of Applied Physics, vol. 18, 1979, Sup. 18-1 "High Temperature Single Mode CW Operation with a TJS Laser Using a Semi-Insulating GaAs Substrate".

IEEE Electron Device Letters, vol. EDL-2, No. 1, Jan. 1981, "Modulation-doped MBE GaAs/n-Al$_x$Ga$_{1-x}$As MESFETs".

Applied Physics Letters, vol. 36, No. 3, Feb. 1980, pp. 181-183 "Monolithic Integration of a GaAlAs Injection Laser with a Schottky-Gate Field Effect Transistor".

Primary Examiner—Andrew J. James
Assistant Examiner—Donald J. Featherstone
Attorney, Agent, or Firm—Nutter, McClennen & Fish

[57] ABSTRACT

A monolithic semiconductor structure of a laser and a field effect transistor applicable to telecommunications comprises, on a semiinsulating substrate, a semiconductor layer of Ga$_{1-x}$Al$_x$As, a N-doped semiconductor layer of Ga$_{1-y}$Al$_y$As, a semiconductor layer of Ga$_{1-z}$Al$_z$As, in which x and z vary from 0.2 to 0.7 and y from 0 to 0.15 and a GaAs semiconductor layer. In these four layers are formed one type P region and two type N regions, the type P region and one of the type N regions defining between them the active zone of the laser and the two type N regions defining between them the active zone of the transistor, respectively forming the transistor source and drain. The P region of the laser is equipped with an electrode and the transistor source and drain with ohmic contacts. A process for making the structure as also disclosed.

14 Claims, 5 Drawing Sheets

MONOLITHIC SEMICONDUCTOR STRUCTURE OF A LASER AND A FIELD EFFECT TRANSISTOR

The present invention relates to a planar monolithic semiconductor structure for a laser and a field effect transistor, said transistor forming part of the modulation or control circuit of the laser. It also relates to a process for the production of said structure.

The laser source and its integrated control circuit according to the invention can more particularly be used in the field of telemetry, integrated optics or optical fiber telecommunications.

More specifically, the invention relates to a planar, integrated field effect transistor - laser structure, produced on a III-V material, semi-insulating substrate.

In most known solutions for the integrations of a laser source and a field effect transistor, the semiconductor layer forming the channel of the transistor and the semiconductor layer in which are formed the electric contacts of the transistor, produced by epitaxy or implantation, are added to the growth of the semiconductor layers of the laser.

Known integration solutions are described in the article in Appl. Phys. Lett, 41, 2, p 122-128, of 7.15.1982 and entitled "Very high frequency GaAlAs laser field-effect transistor monolithic integrated circuits" by I. URY and K.Y. LAU, as well as that described in the article Appl. Phys. Lett, 46, 3, pp 226-228, February 1985 entitled "Monolithic Integration of a low threshold current quantum well laser and a driver circuit on a GaAs substrate" by T. SANADA et al. In these two integration solutions, the laser and transistor are juxtaposed on the same GaAs semi-insulating substrate. Moreover, the plane of the PN laser junction is that of the semiconductor layers epitaxied from the substrate. The laser is of the type with vertical injection of the electrons.

At present, the procedure using a laser structure with vertical injection of the electrons is the only one to permit the obtaining of a heterojunction laser. The advantages of such a laser structure are in particular a low threshold current and therefore a slight thermal dissipation, together with a high differential efficiency and consequently a need for a low modulation current. Moreover, the corresponding field effect transistor-laser structures have a limited thermal sensitivity and can operate at high temperatures.

Thus, the performances of these integrated field effect transistor-laser structure are close to those of the discrete components. However, for producing a short gate transistor (with a width at the most of 1 μm) and therefore a high transconductance transistor, it is necessary to form the laser at the bottom of a hole, when said laser is positioned alongside the transistor. In this connection, reference can be made to the aforementioned article by T. SANADA et al.

Unfortunately this technology is relatively complicated and causes problems with regards to producing the resin mask by photolithography and which is used for defining the dimensions of the transistor gate. It is difficult to reproduce this technology. Moreover, to increase the constructional reliability of the transistor, the semiconductor layers of this component must be produced after epitaxy of the semiconductor layers of the laser during supplementary epitaxy operations or ionic implantation operations.

The formation of the PN junction of a laser by the diffusion of dopants into the epitaxied layers of the laser structure is more particularly described in an article by J. K. CARNEY et al, pp 38 to 41, GaAs IC Symposium, 1982, entitled "Monolithic optoelectronic/electronic circuits".

In addition, laser structures on GaAs are known, in which the injection plane of the electrons is perpendicular to the plane of the epitaxied semiconductor lasers, the PN junction of the laser being defined by diffusion of dopants into the semiconductor layers. Such a so-called transverse injection structure (TJS) is described in Jap. Jour of Appl. Phys, vol 18, 1979, supplement 18-1, pp 371-375 entitled, "High temperature single mode CW operation with a TJS laser using a semiinsulating GaAs substrate" by H. KUMABE et al.

Unfortunately this laser structure has the disadvantage of an isolated contact at the top of a mesa on the P region of the laser. Moreover, said structure is a homojunction structure, i.e. with a much higher threshold current than those of heterojunction laser structures and with a differential efficiency below that of heterojunction structures (25% in place of 35% per face). Morever, said transverse injection structure has a critical operating temperature beyond which the threshold current increases very rapidly. This is due to a parallel conduction of the confinement layers of the laser adjacent to the active layer thereof.

Conversely, the modulating frequencies of this laser and the frequency pass band are very high, in view of the limited parasitic capacitances and low contact resistances on region P distributed over a large surface.

SUMMARY OF THE INVENTION

The invention relates to a monolithic semiconductor structure of a laser and a field effect transistor, as well as to its production process making it possible to obviate the disadvantages referred to hereinbefore. In particular, it permits a genuine integration of the laser and field effect transistor according to an entirely planar structure and on the basis of a single epitaxy of the semi-insulating substrate.

More specifically, the invention relates to a monolithic semiconductor structure, produced on a monocrystalline semi-insulating substrate, wherein it comprises first, second and third semiconductor layers superimposed in this order, the second layer having a forbidden band below or narrower than the forbidden bands of the first and third layers, constituting the active layer of the laser and the channel of the transistor.

Throughout the remainder of the description, the second semiconductor layer will also be called the active layer.

The structure according to the invention is much simpler than that of the prior art.

Advantageously, the laser comprises two metal electrodes located in a plane parallel to the semiconductor layers, the source and drain of the transistor being provided with ohmic contact located in said plane.

In order to minimize the contact resistance between the semiconductor layers and the electrodes, on the one hand, and the ohmic contacts, on the other, the semiconductor structure according to the invention is advantageously provided on the third semiconductor layer with a fourth semiconductor layer having a forbidden band below or narrower than that of the first and third layers.

The semiconductor structure according to the invention is produced on a monocrystalline substrate of III-V material, which can be InP, GaAs, GaSb, InAs or InSb.

In the case of a GaAs substrate, the first, second and third semiconductor layers are respectively made from undoped $Ga_{1-x}Al_xAs$, N-doped $Ga_{1-y}Al_yAs$ and undoped $Ga_{1-z}Al_zAs$, with $0<x\leq 1$, $0\leq y<1$ and $0<z\leq 1$, x and z being greater than y. Moreover, the fourth semiconductor layer is of undoped GaAs.

With such a structure, a laser source is obtained which more particularly emits a wavelength of 0.85 μm. This structure can then be used in the field of short distance telecommunications.

The term undoped material, is understood to mean layers or materials which are not intentionally doped. The residual impurities of these layers or materials, of the order of $10^{15}$ to $10^{16}$ atoms/cm$^3$, are of type N or P. They are inherent in the epitaxy processes of the layers and the starting products, which are not 100% pure.

In the case of a InP substrate, the first, second, third and fourth semiconductor layers can be respectively produced from undoped InP, N-doped $In_tGa_{1-t}As_{t'}P_{1-t'}$, with $0\leq t<1$ and $0<t'<1$, undoped InP and undoped InP or $In_sGa_{1-s}As$ with $0<s<1$. With such a structure, a laser source is obtained which emits a wavelength of 1.3 or 1.55 μm, as a function of the values of t and t'. This structure can be used in telecommunications for long distance transmissions.

According to a preferred embodiment of the invention, the structure comprises, on a GaAs substrate:

a first undoped $Ga_{1-x}Al_xAs$ semiconductor layer with $0.2\leq x\leq 0.7$, covered with a second N-doped $Ga_{1-y}Al_y$ As semiconductor layer with $0\leq y\leq 0.15$, forming the active layer of the laser and the channel of the transistor, a third undoped $Ga_{1-z}Al_z$ As semiconductor layer with $0.2\leq z\leq 0.7$ covering the second layer, a fourth undoped GaAs semiconductor layer covering the third layer, a first type P region, a second and a third type N regions, oriented perpendicularly to the planes of the first, second, third and fourth layers, the first and second regions defining between them the active zone of the laser, the second and third regions respectively forming the drain and source of the transistor, defining between them the transistor channel, a Au-Zn electrode covering the type P region, a AuGeNi ohmic contact covering each of the N type regions, and a TiPtAu gate surmounting the transistor channel.

This structure differs from the known structures in that the first, third and fourth semiconductor layers are not doped. In this case the $R_3/R_2$ and $R_1/R_2$ ratios, $R_1$, $R_2$ and $R_3$, respectively, representing the resistances of the first, third and fourth layers, are greater by a factor of at least 10 than those of the prior art layers (cf. aforementioned KUMABE article), which permits operation at a higher temperature.

Moreover, the parasitic capacitances of this structure are lower than those of the prior art structures, which permits operation in a higher frequency pass band. In order that the light intensity supplied by the laser source is high and the threshold current of said source low, preferably the active semiconductor layer of the integrated structure is formed as a superlattice constituted by two alternating series of semiconductor films having a different composition, i.e. with a different value of y. This procedure, described in the aforementioned SANADA article and called "multi-quantum well" (MQW) also makes it possible to use lower laser modulating currents, as a result of a higher differential efficiency. It also makes it possible to obtain a field effect transistor operating more quickly than a conventional transistor with respect to the quantum transistor. Moreover, the corresponding integrated structure has an even lower thermal sensitivity (To).

In another variant, the semiconductor active layer of the structure has a composition y in which y varies progressively in the thickness of the layer. This method (which is also described in the SANADA article) is generally known as GRINSCH (graded index separate confinement heterostructure).

To ensure a maximum confinement of the light, the active semiconductor layer has a relatively limited thickness. When said layer has a conventional structure (y constant), the thickness varies from 50 to 500 nm. For a quantum layer (y variable), the thickness varies from 10 to 50 nm.

With the object of reducing the threshold voltage of the field effect transistor, the gate thereof is advantageously located at a lower level than that of the ohmic contacts of the source and drain.

The invention also relates to a process for producing a monolithic semiconductor structure of a laser and a field effect transistor, as described hereinbefore.

According to the invention, this process comprises:

epitaxying on the substrate, in order, first, second and third semiconductor layers, the second layer having a forbidden band below the forbidden bands of the first and third layers, constituting the active layer of the laser and the channel of the transistor, introducing ions into the semiconductor layers for forming a first region of a first conductivity type, second and third regions of a second conductivity type, which are oriented perpendicularly to the planes of the semiconductor layers, the first and second regions defining between them the active zone of the laser, the second and third regions, respectively, forming the transistor drain and source, defining between them the transistor channel, and forming the electrodes of the laser, the ohmic contacts of the source and the drain of the transistor, as well as the gate of the transistor.

This process is easy to perform, its stages are not critical and it is reproducible.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

The following description relates to a planar structure according to the invention of AlGaAs/GaAs, whereby said material type is the most commonly used. However, the invention also applies to other III-V structures and in particular to InGaAsP/InP or GaAsP/GaAs structures.

The monolithic structure according to the invention is formed, as shown in FIGS. 1 to 11, on a semi-insulating, monocrystalline GaAs substrate 2, obtained by cleaving, having a width L (FIG. 11) of e.g. 300 $\mu$m, a length of 1000 $\mu$m and a thickness of 300 $\mu$m. This substrate 2 e.g. has a crystallographic orientation (001) according to its thickness and an orientation (110) according to its width.

Figure 1:
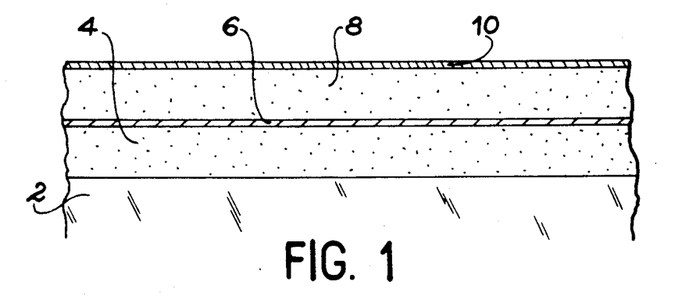
FIGS. 1 to 11. Different stages of the production of a semiconductor structure according to the invention, FIGS. 1 to 10 being longitudinal sectional views and FIG. 11 being a perspective view.

As shown in FIG. 1, on substrate 2 are formed by epitaxy four superimposed semiconductor layers which, starting from the substrate, carry the reference 4, 6, 8 and 10. Layer 4 is of $Ga_{1-x}Al_x$ As, not intentionally doped with $0 < x \leq 1$ and e.g. $0.2 \leq x \leq 0.7$. This semiconductor layer 4 has a thickness of approximately 0.5 $\mu$m.

The second semiconductor layer 6, which forms the active layer of the laser and the channel of the field effect transistor, is made from N-doped $Ga_{1-y}Al_y$ As with $0 \leq y < 1$. In particular, y is such that $0 \leq y \leq 0.15$. The N doping of said semiconductor layer 6 can be performed with silicon or tin at a concentration of a few $10^{17}$ atoms/cm$^3$. Layer 6 has a thickness of approximately 0.15 $\mu$m.

The third semiconductor layer 8 is made from $Ga_{1-z}Al_z$As, which is not intentionally doped and with $0 < z \leq 1$. In particular, z is such that $0.2 \leq z \leq 0.7$. This semiconductor layer must have a thickness which is reduced to the greatest possible extent to permit successive diffusions or ionic implantations into the active layer 6. A thickness of approximately 0.5 $\mu$m is suitable. The fourth semiconductor layer is made from not intentionally doped GaAs. It has a thickness of approximately 0.1 $\mu$m.

These four semiconductor layers 4, 6, 8 and 10 are advantageously produced by metal organic chemical vapour deposition (MOCVD) or molecular beam epitaxy (MBE).

Layers 6 and 10 containing an aluminum composition below that of layers 4 and 8 have a lower or narrower forbidden band than that of layers 4 and 8 and, respectively, constitute the active layer of the integrated semiconductor structure and the electric contact layer for the laser and the field effect transistor. The semiconductor layers 4 and 8 constitute the confinement layers of the electrons, and consequently the light, produced in the active zone of the laser.

A typical composition of the four semiconductor layers epitaxied onto the insulating substrate is layer 4 of $Al_{0.6}Ga_{0.4}As$, layer 6 of $Al_{0.08}Ga_{0.92}As$ doped with silicon at a concentration of $5.10^{17}$ atoms/cm$^3$, layer 8 of $Al_{0.6}Ga_{0.4}As$ and layer 10 of GaAs.

Following the deposition of the four semiconductor layers, the PN junction of the laser, the source and drain of the FET are formed by diffusion or implantation of ions into the four semiconductor layers. To form the PN junction of the laser, use is made of ions with two different conductivity types N and P and for forming the transistor source and drain, use is made either of type N ions, or of type P ions.

Figure 2:
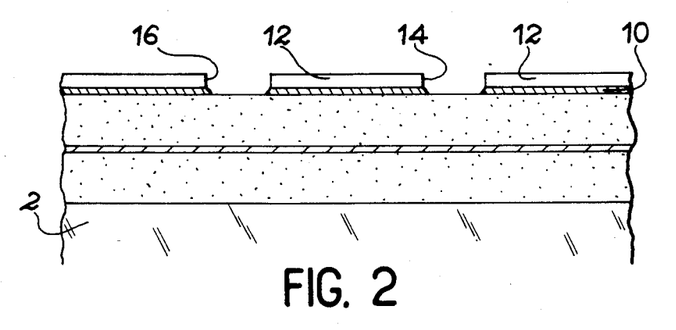

For this purpose, using conventional photolithography processes, firstly a resin mask 12 is made, which has two openings 14 and 16, as shown in FIG. 2. These openings 14, 16 respectively define the dimensions of the active zone or channel of the FET and the dimensions of the active zone of the laser. For example, the resin used is a positive phenol formaldehyde resin marketed under reference AZ 1350 H by Shippley. The openings 14 and 16 made in said resin have a width between 3 and 5 $\mu$m and a length equal to the width L of substrate 2.

Using the resin mask 12, semiconductor layer 10 is etched and this consists of eliminating the areas therefrom which are not covered with resin. Etching can be carried out by selective chemical etching, i.e. only attacking layer 10. The etching agent can be a mixture of $NH_4OH$, $H_2O_2$ and $H_2O$ with volume quantities 1/7/16. This is followed by the elimination of the resin mask 12 by chemical dissolving, e.g. with acetone.

Figure 3:
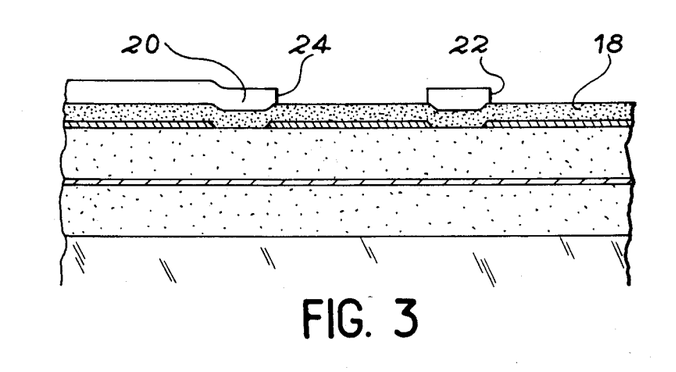

The following stage of the process comprises, as shown in FIG. 3, depositing an insulating layer 18 on the complete structure. This insulating layer 18, which can have a thickness of approximately 200 nm, can be of silicon dioxide ($SiO_2$) or silicon nitride ($Si_3N_4$). This insulating layer 18 can be deposited by a chemical vapour deposition process. The deposition temperature for a $Si_3N_4$ or $SiO_2$ layer is approximately 400° C.

On the insulating layer 18 is then formed a resin mask 20, e.g. a positive resin mask having the same composition as mask 12.

Mask 20 has openings 22 and 24, whereof the dimensions are those of the source and drain of the field effect transistor to be produced. These openings are approximately 200 $\mu$m wide.

Figure 4:
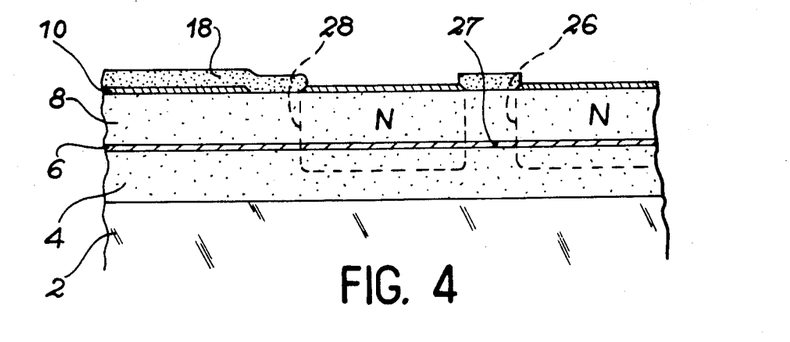

Through this resin mask 20 and as shown in FIG. 4, is carried out the etching of the insulating layer 18, which consists of eliminating those areas of said layer not covered with resin 20. In the case of a $Si_3N_4$ layer 18, etching can be carried out by a reactive ionic process using a $CF_4$ plasma containing 8% $O_2$.

This is followed by an implantation or diffusion of ions into the four semiconductor layers 4, 6, 8 and 10 and perpendicular to said layers in order to form the transistor source 26 and drain 28. The etched insulating layer 18 serves as a mask for said ion implantation or diffusion. The diffused or implanted regions 26, 28 define between them the active zone 27 of the transistor channel, said zone 27 being located in the active layer 6 of the structure. The width of said active zone is equal to the substrate width L.

The formation of a type N drain and source is brought about with the aid of diffusion or implantation of sulphur or tin ions. In the case of sulphur diffusion, the latter can be effected in a semi-closed crucible at atmospheric pressure and under scavenging by gas containing 15% $H_2$ and 85% Ar, at 850° C. and for 4 hours. This diffusion method makes it possible to obtain N layers of approximately 0.9 $\mu$m containing $5.10^{17}$ to $2.10^{18}$ atoms/cm$^3$ of sulphur.

When the transistor source and drain are produced by ion implantation, the latter can be carried out without using the etched insulating layer 18 as the implantation mask, resin 20 then serving as the implantation mask. The ion implantation depth is linked with the energy of the ion beam.

After forming source 26 and drain 28 of the FET, using the etched insulating layer 18 as the mask, said insulating mask is eliminated by means of a reactive plasma of CF$_4$ containing 8% O$_2$, in the case of a Si$_3$N$_4$ layer.

Figure 5:
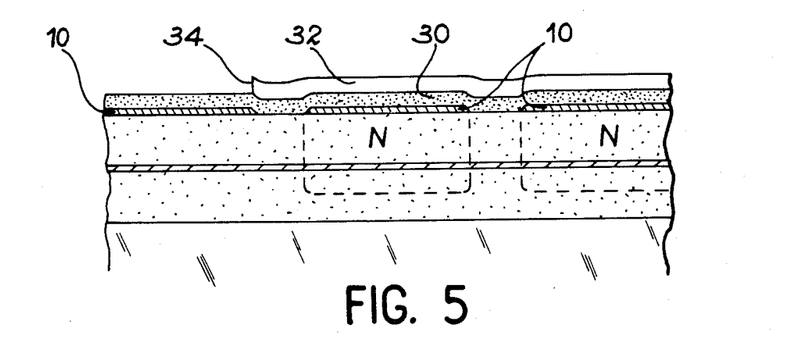

This is followed by the deposition on the structure obtained and as shown in FIG. 5 of a further 200 nm insulating layer 30 of silicon dioxide or silicon nitride. Deposition takes place under the same conditions as for layer 18.

On insulating layer 30 is formed a positive resin mask 32 using conventional photolithography processes. This mask has an opening 34 with a width of approximately 200 μm, which makes it possible to define the dimensions of the P region of the PN junction of the laser, the N region 28 constituting the other part of said PN junction.

This is followed by the elimination of the zones of insulating layer 30 not covered with resin 32 under the same conditions as hereinbefore using plasma etching with CF$_4$ and 8% O$_2$ for a Si$_3$N$_4$ layer 30. Resin mask 32 is then eliminated chemically.

Figure 6:
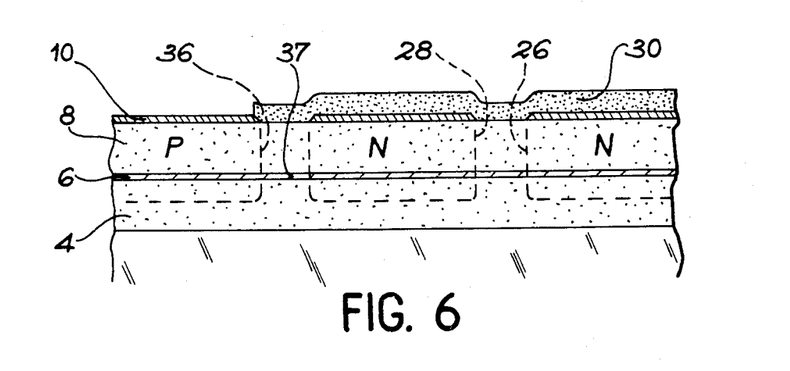

As shown in FIG. 6, this is followed the diffusion or implantation of P ions into the four semiconductor layers 4, 6, 8, 10 to form the P region 36 of the laser. The N and P regions 28, 36 respectively, which can be diffused or implanted, define between them the active zone 37 of the laser and which is located in the active layer 6 of the structure. The length of the active zone of the laser is equal to the width L of the substrate.

The ions used can be zinc or beryllium ions. In the case of zinc diffusion, it is possible to work at atmospheric pressure, in a semi-closed crucible, at a temperature of 650° C. and for 2 hours. This diffusion method makes it possible to obtain a P region 36 of approximately 0.9 μm containing $5.10^{17}$ to $10^{19}$ atoms/cm$^3$.

When the P region is formed by ionic implantation, the latter can be carried out by using resin mask 32 as the implantation mask.

To ensure that the diffusion of zinc or beryllium ions does not continue during the formation of the N type regions by diffusion, it is preferable to carry out the P type diffusion after the N diffusion. Thus, the P diffusion is carried out at a much lower temperature than that required for the N diffusion.

As stated hereinbefore, the N type FET can be replaced by a P type FET. In this case regions 26 and 28 will be of the P type and region 36 of the N type.

After forming the P type region 36 using the insulating layer 30 as the mask for said diffusion, layer 30 is eliminated e.g. using a reactive plasma of CF$_4$ and 8% O$_2$ for a Si$_3$N$_4$ layer.

The following stages consist of producing the electrode of the laser and the ohmic contacts of the source and drain of the FET.

Figure 7:
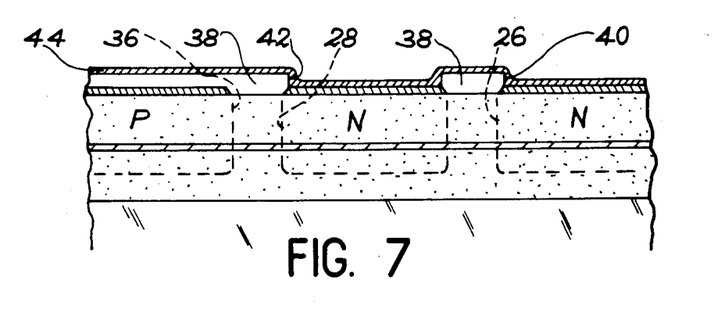

As shown in FIG. 7, the ohmic contacts of source 26 and drain 28 of the transistor are obtained by forming on the structure a resin mask 38 with openings 40, 42 defining the dimensions of the ohmic contacts of the transistor source and drain. These window 40, 42 face the N regions and have the same dimensions as said regions.

An approximately 50 nm metal deposit 44 is then made on resin layer 38. For example, deposit 44 is formed from at least two superimposed metal layers able to form a single metal layer by alloying. In particular, this deposit can be formed by a nickel layer, a geranium layer and a gold layer for forming ohmic contacts of AuGeNi.

Figure 8:
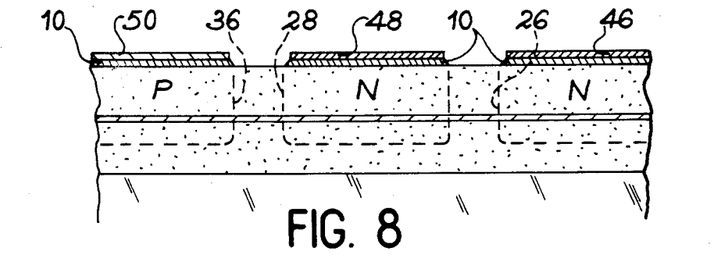

This is followed by dissolving e.g. in acetone of the resin layer 38, which carries with it those parts of the metal deposit 44 positioned above the same. This selective deposition method is known as lift-off. The structure obtained is shown in FIG. 8. The ohmic contacts of source 26 and drain 28 of the transistor carry the references 46 and 48.

Using the same lift-off method, an e.g. 50 nm thick electrode 50 is formed on the P region 38 of the laser. Electrode 50 is in particular of AuZn, said material being obtained by alloying a superimposed gold layer and zinc layer.

Metal deposit 50 could have been formed prior to making metal deposit 44. Moreover, the ohmic contact 48 of the transistor drain also constitutes the electrode of the N region of the PN junction of the laser.

After forming metal deposits of the laser and transistor, annealing takes place for approximately 30 minutes at 560° C., in order to transform the conductive deposits into ohmic contacts by alloying.

It is possible to obtain a planar structure, particularly through producing the laser and FET by ion implantation or diffusion into the same semiconductor layers epitaxied on a same substrate and in particular forming the transistor channel and the active layer of the laser in the same semiconductor layer 4 and forming the ohmic contacts of the transistor source and drain and the laser in the same semiconductor layer 10. Thus, the electrode 50 of the laser and the ohmic contacts 46, 48 of the transistor source and drain are coplanar. This planar structure will make it possible to produce without any difficulty a short gate, e.g. approximately 1 μm for the field effect transistor.

The following stages of the process relate to the production of a buried short gate. The use of a buried gate, when permitted by the thickness of the semiconductor layer 8 makes it possible to reduce the transistor threshold voltage.

Figure 9:
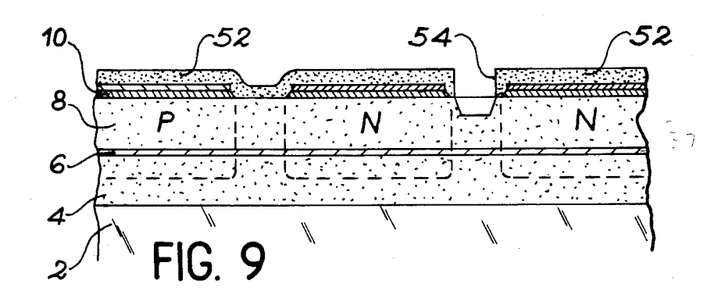

After annealing at 560° C. and as shown in FIG. 9, on the structure is produced a resin mask 52, particularly a positive resin mask, which has an opening 54 above and facing the active zone 37 of the FET. The width of this opening is slightly less than that of the active zone.

Through mask 52, obtained according to conventional photolithography processes, etching is carried out over a height of approximately 0.4 μm of the region of the semiconductor layer 8 not covered with resin. This can be carried out by selective chemical etching e.g. using a solution of H$_3$PO$_4$—H$_2$O$_2$—H$_2$O (6/3/100).

Figure 10:
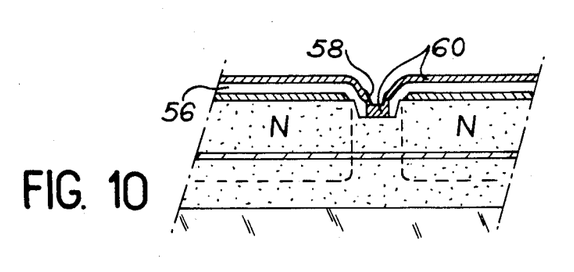

After etching layer 8, followed by the elimination of resin layer 52, the transistor gate is deposited, e.g. by lift-off. To this end and as shown in FIG. 10, on the complete structure is placed a positive resin layer 56 and in said layer an approximately 1 μm wide opening 58 is produced by photolithography. Opening 58 defines the dimensions of the gate of the transistor to be produced. Resin layer 56 is then covered by a metal deposit 60, e.g. formed from three superimposed layers, respectively of titanium, platinum and gold. The use of three superimposed layers makes it possible to obtain a good Schottky contact. This metal deposit 60 has a thickness of approximately 200 nm. The resin mask 56 is then dissolved with acetone. The final structure is shown in perspective in FIG. 11.

Figure 11:
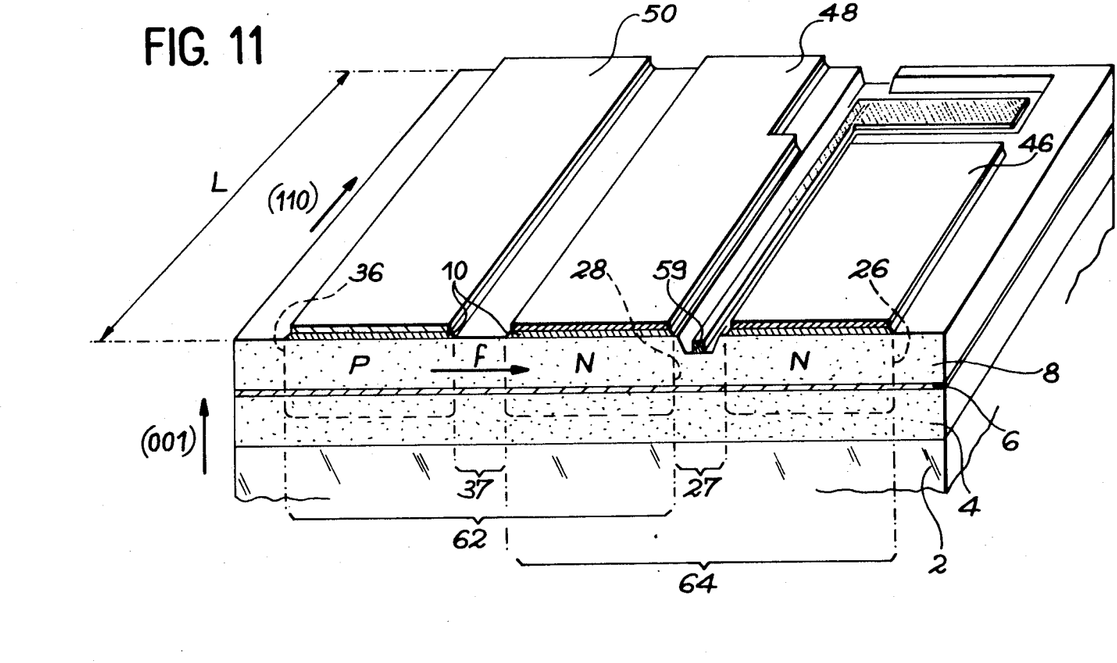

In FIG. 11, the PN junction laser 36, 28 carries reference 62. In order to symbolize its operation by transverse injection of electrons, an arrow f is shown in the active zone 37 of the laser. The field effect transistor carries the general reference 64 and has source 26, drain 28 and gate 59.

The remarkable thing about this monolithic structure is that the N region 28 serves both as the N region for the PN junction of the laser and as the drain for the FET. In the same way, ohmic contact 48 serves both as the electrode for the laser and as ohmic contacts for the transistor drain. Moreover, the laser electrodes 50 and 48 extend completely across the structure.

Figure 12:
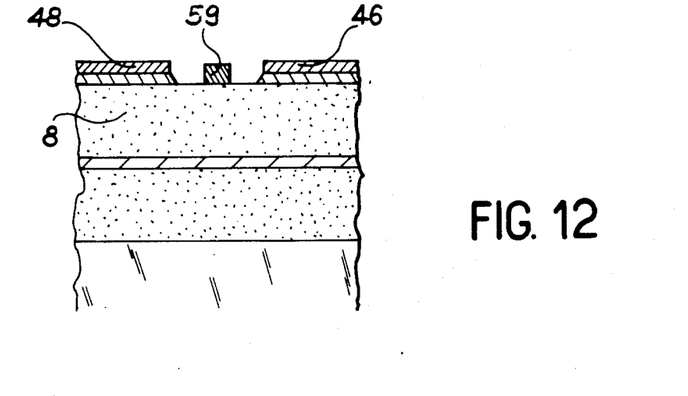
FIG. 12. A constructional variant of the field effect transistor of the structure according to the invention.

The above description has referred to a monolithic structure in which the transistor gate 59 was buried. However, as shown in FIG. 12, it is possible to produce the transistor gate 59 without previously etching the semiconductor layer 8.

The previously described monolithic structure according to the invention had a semiconductor active layer 6 produced from N-doped $Ga_{1-y}Al_yAs$, in which y retained a constant value over the entire thickness of the layer. Active layer 6 was of a conventional nature. In particular, y, commonly called composition, was equal to 0.08. However, in order to improve the lateral confinement of the electrons, particularly between P and N regions 36,28 respectively of the laser and therefore to increase the light intensity of the light emitted in layer 6 and consequently the threshold current of the laser, it is possible to produce the semiconductor layer 6 in quantum form, i.e. from a material in which the composition y varies in the thickness of the layer. This variation y as a function of the depth P of the layer can be in the form of a rectangular alternative function, as shown in FIG. 13, or in the form of a funnel, as shown in FIG. 14.

Figure 13:
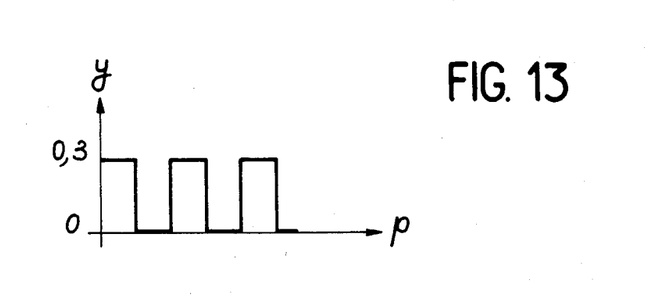
FIG. 13. A curve giving the variations of the composition y of the active layer of the structure according to the invention as a function of the depth p of said layer, according to a first variant.
Figure 14:
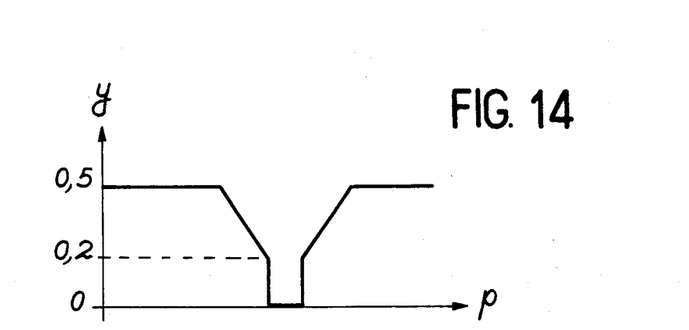
FIG. 14. A curve giving the variations of the composition y of the active layer of the structure according to the invention as a function of the depth of said layer, according to a second variant.

The variations of the composition y of semiconductor layer 6, as shown in FIG. 13, can be brought about by depositing two layers of different compositions, e.g. $y=0$ and $y=0.3$ in alternating form, said two separate layers having an identical thickness, e.g. 10 nm. The layers of composition $y=0$ are preferably undoped and the layers of composition $y=0.3$ are preferably N-doped.

The quantum semiconductor layer can have a total thickness equal to 70 nm. This semiconductor layer of the superlattice type, symbolizing a succession of potential barriers and potential wells for the electrons (multiquantum well), not only makes it possible to improve the emitting properties of the laser, but also the operating characteristics of the FET. In particular, the operating speed is increased, due to an increased mobility of the carriers confined in a bidimensional potential well.

One of the reasons for the improvement in the emitting properties of the laser is the formation of a selective alloy defect in the P and N regions during ion implantation or diffusion, leading to the formation of a heterojunction in the diffusion or implantation front plane.

The active layer 6 of the structure according to the invention, whose composition y varies progressively as a function of the depth P of said layer and as shown in FIG. 14, is known as GRINSCH.

The above description has only been given in an exemplified manner and all modifications are possible thereto without passing beyond the scope of the invention. In particular, the thickness, doping and composition of the different semiconductor layers of the laser-field effect transistor structure according to the invention can be modified.

What is claimed is:

1. A monolithic semiconductor structure of a laser and a field effect transistor, produced on a monocrystalline semi-insulating substrate and comprising a first, a second and a third semiconductor layer superimposed in this order, said second layer constituting the active layer of said laser and the channel of said transistor and having a forbidden band narrower than the forbidden bands of said first and third layers which are formed with an undoped semiconductor material; a first region of a first conductivity type, a second and a third region of a second conductivity type, said regions being formed in said first, second and third semiconductor layers and oriented perpendicularly to the planes of said first, second and third layers, said first and second regions defining between them said active zone of said laser, said second and third regions respectively forming the transistor drain and source and defining between them said transistor channel, the gate of the transistor being situated above said channel.

2. A semiconductor structure according to claim 1, wherein said laser comprises metal electrodes located in a plane parallel to the semiconductor layers, the source and drain of said transistor having ohmic contacts located in this plane.

3. A semiconductor structure according to claim 1, wherein the third semiconductor layer is partly covered with a fourth semiconductor layer serving as an electric contact layer for the laser and the transistor, said fourth layer having a forbidden band narrower than those of the first and third layers.

4. A semiconductor structure according to claim 1, wherein said first, second and third semiconductor layers are respectively produced from undoped $Ga_{1-x}Al_xAs$, N-doped $Ga_{1-y}Al_yAs$ and undoped $Ga_{1-z}Al_zAs$ with $0<x\leq1$, $0\leq y<1$ and $0<z\leq1$, x and z being greater than y.

5. A semiconductor structure according to claim 4, wherein x and z are taken in the range 0.2 to 0.7 and y in the range 0 to 0.15.

6. A semiconductor structure according to claim 3, wherein said fourth semiconductor layer is of undoped GaAs.

7. A semiconductor structure according to claim 1, wherein said substrate is of GaAs.

8. A semiconductor structure according to claim 1, wherein said second semiconductor layer is a superlattice formed from two alternate series of semiconductor films of different composition.

9. A semiconductor structure according to claim 1, wherein said second semiconductor layer has a composition which varies in the thickness of the layer.

10. A semiconductor structure according to claim 2, wherein said transistor gate is located at a level below that of said ohmic contacts of said transistor source and drain.

11. A semiconductor structure of a laser and a field effect transistor produced on a GaAs monocrystalline substrate and comprising
    a first undoped $GA_{1-x}Al_xAs$ semiconductor layer with $0.2\times0.7$, covered with a second N-doped $Ga_{1-y}Al_yAs$ semiconductor layer with $0\leq y\leq0.15$, forming the active layer of said laser and the channel of said transistor;
    a third undoped $Ga_{1-z}Al_zAs$ semiconductor layer with $0.2\leq z\leq0.7$ covering said second layer;
    a fourth undoped GaAs semiconductor layer covering said third layer;
    a first type P region, second and third type N regions formed in said first, second, third and fourth semiconductor layers and oriented perpendicularly to the planes of said first, second, third and fourth layers, said first and second regions defining between them said active zone of said laser, said second and third regions respectively forming the drain and source of said transistor and defining between them said transistor channel;

a Au-Zn electrode covering said type P region;

a AuGeNi ohmic contact covering each of said N type regions; and a TiPtAu gate surmounting said transistor channel.

12. A semiconductor structure according to claim 11, wherein said second semiconductor layer is a superlattice formed from two alternate series of semiconductor films of different compositions.

13. A semiconductor structure according to claim 11, wherein said second semiconductor layer has a composition which varies in the thickness of the layer.

14. A semiconductor structure according to claim 11, wherein said transistor gate is located at a level below that of said ohmic contacts of said transistor source and drain.

* * * * *